US006871309B1

(12) United States Patent
Smith

(10) Patent No.: US 6,871,309 B1
(45) Date of Patent: Mar. 22, 2005

(54) VERIFICATION OF REDUNDANT SAFETY FUNCTIONS ON A MONOLITHIC INTEGRATED CIRCUIT

(75) Inventor: Gregory J. Smith, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 657 days.

(21) Appl. No.: 09/841,775

(22) Filed: Apr. 24, 2001

(51) Int. Cl.[7] .............................................. G01R 31/28
(52) U.S. Cl. ...................................................... 714/724
(58) Field of Search .............................. 714/724, 820, 714/702, 710, 6

(56) References Cited

U.S. PATENT DOCUMENTS 4,233,682 A * 11/1980 Liebergot et al. ........... 714/820
4,821,271 A * 4/1989 Kini et al. .................. 714/820
4,903,270 A * 2/1990 Johnson et al. ............. 714/820
6,546,511 B1 * 4/2003 Sim et al. ................... 714/724

* cited by examiner

Primary Examiner—Shelly A Chase
(74) Attorney, Agent, or Firm—Merchant & Gould P.C.; Timothy P. Sullivan

(57) ABSTRACT

A method and apparatus for verifying that redundant circuits are truly redundant is provided. Extra circuitry is included within the integrated circuit to test the features of a chip. Without testing of the redundant fictions on the circuit, true redundancy of the functions contained on the chip are not known. Tests are conducted through the extra circuitry to determine if the functions within the chip are independently operational. The extra circuitry may also be used to trim the circuitry within the chips. The extra circuitry consists of pins and switches coupled to nodes within the circuit to allow testing of the redundant functional blocks.

22 Claims, 8 Drawing Sheets

VERIFICATION OF REDUNDANT SAFETY FUNCTIONS ON A MONOLITHIC INTEGRATED CIRCUIT

FIELD OF THE INVENTION

The present invention relates to electronic circuits, and more particularly to redundant safety verification of functions contained within an integrated circuit.

BACKGROUND OF THE INVENTION

Integrated circuits are commonly used to provide critical safety operations due in part to their high level of reliability and their ability to economically combine many functional blocks onto a single chip. One such integrated circuit is the prevention electronics circuit embedded in rechargeable lithium-ion battery packs used to detect and limit improper charging conditions.

When a functional block fails on an integrated circuit, catastrophic results may occur. For example, if a functional block that determines the temperature on the prevention electronics embedded in a battery pack fails, the battery's life could be diminished, or worse, the battery could explode. Some integrated circuits include redundant functional blocks to help ensure proper operation of the circuit in cases where one of the functional blocks fails. In the above example, for instance, if a redundant functional block to determine the temperature on the chip is included, the potential problems may be avoided.

Functional blocks on a chip may be connected in such a way that nonfunctional blocks are bypassed or at least cause fail-safe operation. As a result, a failure in any one functional block may not impede the overall operation of the circuit. Therefore, it may not be possible that a failure on a chip be discernable from an external measurement or inspection.

SUMMARY OF THE INVENTION

The present invention is directed at providing a method and apparatus for verification of redundant functions on a chip. Without testing of the redundant functions on the circuit, true redundancy of the functions contained on the chip are not known. Tests are conducted through the extra circuitry to determine if the functions within the chip am independently operational. The extra circuitry may also be used to trim the circuitry within the chips. The extra circuitry consists of pins and switches coupled to nodes within the circuit to allow testing of the redundant functional blocks.

According to one aspect of the invention, individual blocks are isolated so that verification of the chip's redundancy may be tested. Extra circuitry is included within the integrated circuit to test the features of a chip.

According to another aspect of the invention, nodes are included within the circuit and are arranged to access each of the redundant functions within the circuit. A test interface circuit receives an input signal, and in response to the input signal, supplies a test signal, indicating a function on the circuit to test. A circuit function block is arranged to receive the test signal, and in response to the test signal, couples at least one of the nodes to an external connection such that the function may be tested.

According to yet another aspect of the invention, the circuit includes a configuration, control and testing circuitry for a mixed signal circuit. A protocol logic interface circuit is arranged to receive a control signal and activate a test mode within the circuit in response to the control signal. The test mode tests a functional block and a redundant functional block within the circuit. The mixed signal circuit includes access lines to internal nodes and external nodes of the integrated circuit that are activated or deactivated in response to the test mode. A switch circuit connects the internal nodes and external nodes to the output pins in response to the test mode to test the functional block and the redundant functional block within the circuit.

According to another aspect of the invention, a method is directed at verifying redundancy of functions within a circuit. A test or tests are created to verify the redundancy of the functional block within the circuit. The tests are performed on each of the functional blocks that are redundant. Based on the performance of the test, a determination may be made as to whether the functional blocks are truly redundant.

DETAILED DESCRIPTION OF THE PREFERRED EMBODIMENT

Figure 1:
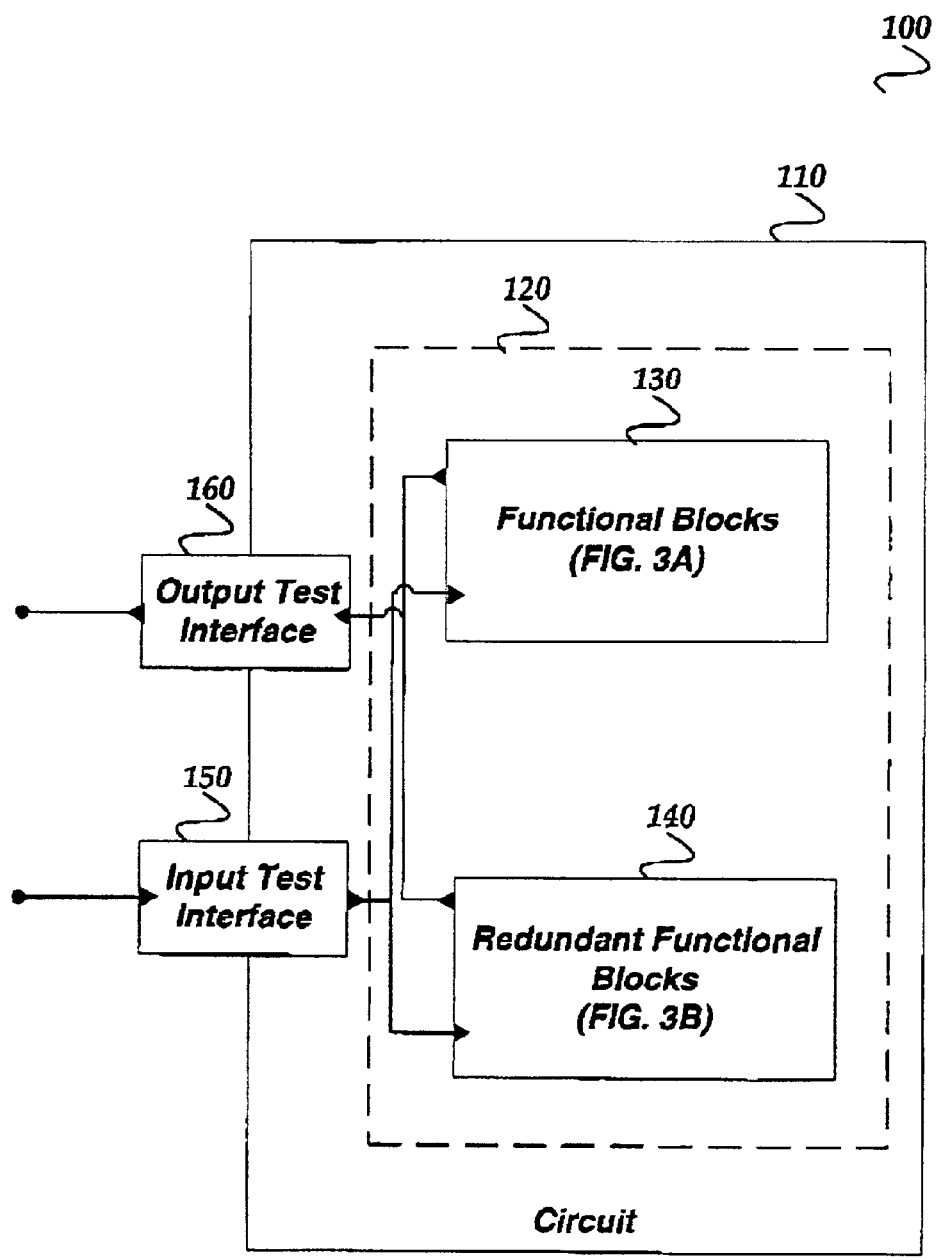
FIGS. 1 and 2 each show a schematic block diagram of a redundancy verification system.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

Briefly described, the present invention is directed at a method and system for verifying redundant functions included on an integrated circuit (IC). According to one embodiment, the method and system may be applied to functions that rely on redundancy for self-healing of random defects. For explanation purposes only, the IC example provided within the description is a power shunt regulator that is directed at limiting the maximum voltage that can be applied to a lithium-ion cell.

FIG. 1 shows an overview schematic diagram of a redundancy verification system according to one embodiment of the invention. As shown in the figure, redundancy verification system 100 includes an IC 110. IC 110 includes circuit function block 120, input test interface 150, and output test interface 160. Circuit function block 120 includes functional blocks 130, and redundant functional blocks 140.

Functional blocks 130 and redundant functional blocks 140 are coupled to an input test interface 150 and an output test interface 160. Input test interface 150 includes an input port for receiving an input signal, and an output port coupled and arranged to communicate with functional blocks 130 and redundant functional blocks 140. Output test interface 160 includes an output port for outputting a signal, and an input port arranged to communicate with functional blocks 130 and redundant functional blocks 140.

IC 110 includes a circuit function block 120 that performs various functions. For example, for one integrated circuit, the functions may be prevention electronics embedded in a rechargeable lithium-ion battery pack. Redundant functional blocks 140 perform the same corresponding functions as functional blocks 130. The redundant fictional blocks 140 allow operation of IC 110 in situations when one of functional blocks 130 fails. According to one embodiment of the invention, N functional blocks and redundant functional blocks may be included on IC 110 (See FIGS. 3A and 3B, and related discussion).

Input test interface 150 receives a signal indicating the function(s) to test within functional blocks 130 and redundant functional blocks 140. The testing of the functions on IC 110 helps to ensure that the primary functions and the redundant functions are working properly. Input test interface 150 supplies a test signal to nodes within functional blocks 130 and redundant functional blocks 140 indicating what portions of the blocks to test. Output test interface 160 provides external signals from IC 110 related to the nodes within IC 110 depending on the function(s) tested within functional blocks 130 and redundant functional block 140. According to one embodiment of the invention, each function within IC 110 may be verified to be redundant.

Figure 2:
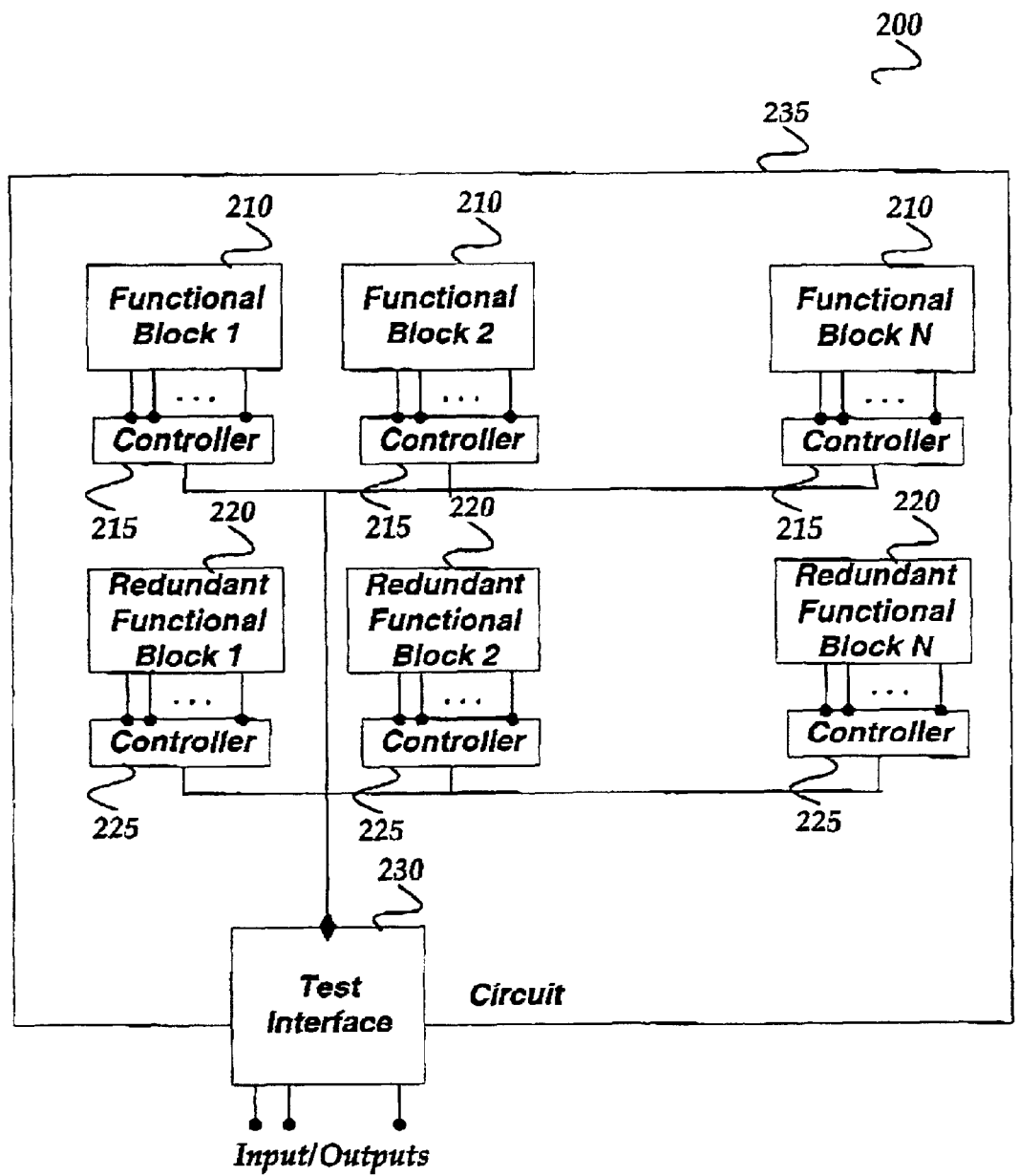

FIG. 2 illustrates a schematic diagram of a redundancy verification system according to one embodiment of the invention. As shown in the figure, redundancy verification system 200 includes functional blocks 210 (1 to N), controllers 215 (1 to N), redundant functional blocks 220 (1 to N), redundant controllers 225 (1 to N), and a test interface 230 included within IC 235.

Test interface 230 includes input/output pins to communicate with external circuitry (not shown). Test interface 230 is coupled and arranged to communicate with the N controllers 215 and the N redundant controllers 225. Each of the N controllers 215 and the N redundant controllers 225 have input/output ports coupled to their respective functional block 215 or redundant functional block 220.

Test interface 230 is arranged to receive input signals that determines what blocks are tested within IC 235. Through the use of test interface 230 the user may selectively test functional blocks, or even test just portions of the functional blocks. This allows the user complete control over testing the individual components within the functional block 210 and redundant functional block 220.

Test interface 230 provides a signal to the respective controller coupled to the block to access specific nodes within the functional block 210 or redundant functional block 220. Test interface 230 also receives signals from the controllers coupled that are output for test purposes. For example, to access specific nodes within functional block 1 to test certain functions, a user may provide a signal to test interface 230 indicating what nodes of functional block 1 the user wants to access. The controller associated with functional block 1 receives the signal and provides access to the specified nodes of functional block 1 that may be accessed through the input/output pins of test interface 230. At this point, the user may perform tests utilizing the accessed nodes to verify redundancy of the function.

Figure 3A:
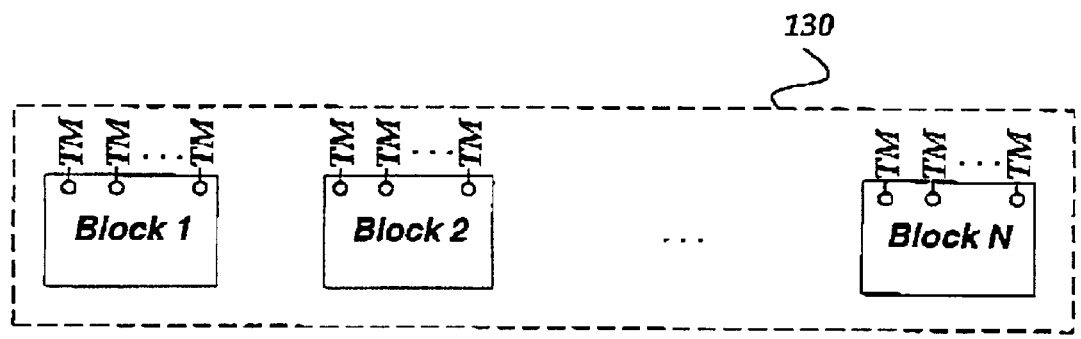
FIGS. 3A and 3B illustrate functional and redundant functional blocks.
Figure 3B:
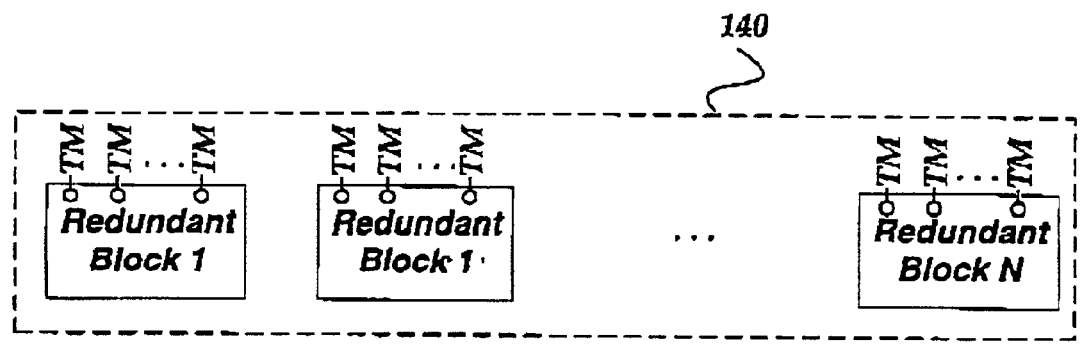

FIGS. 3A and 3B illustrate functional and redundant functional blocks, according to one embodiment of the invention. As shown in FIG. 3A, functional blocks 130 (FIG. 1) include N blocks. Each of the N blocks include N test mode (TM) pins. Similarly, FIG. 3B includes N redundant blocks, each having N TM pins. Therefore, there will be at least two functional blocks for every critical function within the IC. A critical function is a function that is required for correct operation of the IC. Each functional block has at least one test pin. A test pin is included for each part of the functional block that may be tested. For example, if the block uses two external signals to test the function, there will be at least two TM pins. Some functional blocks may have only one test pin, while others may have ten, twenty, one hundred, or more, test pins.

Each block within functional blocks 130 performs some operation on the chip. Similarly, each block within redundant functional blocks 140 provides redundancy for functional blocks 130. The number of test modes for each of the blocks depends on the functionality performed by the block, the complexity of the block, as well as the importance of the block. For example, a critical safety block for an IC may have more test modes than a non-critical block.

Figure 4:
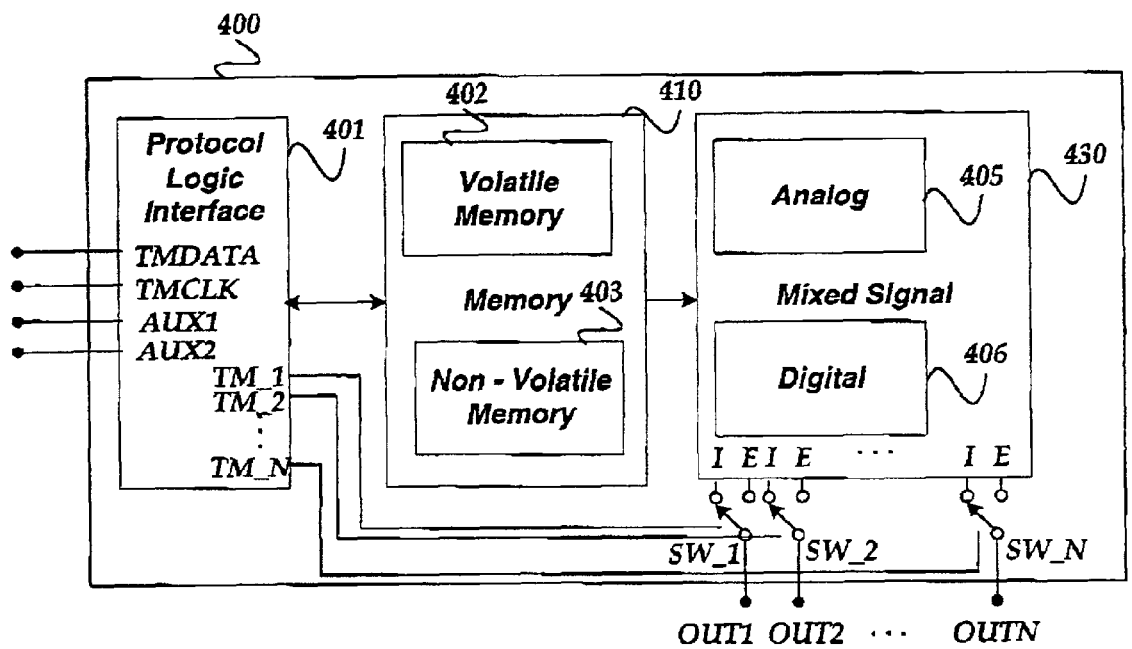
FIG. 4 shows a schematic block diagram of an electronic system with a protocol logic interface for controlling and configuring the analog and digital portions of a redundancy verification system.

FIG. 4 shows a schematic block diagram of an electronic system with a protocol logic interface for controlling and configuring the analog and digital portions of a redundancy verification system. As shown in the figure, the electronic system 400 includes a protocol logic interface 401, a memory 410 including a volatile memory 402 and non-volatile memory 403, and mixed signal circuitry 430 including an analog portion 405 and a digital portion 406. Mixed signal circuitry 430 also includes a plurality of access lines to external nodes E and internal nodes I of the IC (such as the IC shown in FIG. 1). External nodes are circuit nodes that are connected to the system output pins during normal operation. Internal nodes may be critical points in the analog portion of the system. Finally, electronic system 400 includes N switches, SW—1–SW_N, for selectively connecting either the internal nodes or the external nodes to corresponding n output pins OUT1–OUTN, respectively, of the electronic system.

Protocol logic interface 401 includes data input pins TMDATA, TMCLK, AUX1, and AUX2, test mode output ports TM_1–TM_N, and an input/output port coupled to memory 410. Memory 410 has an input/output port coupled to protocol logic interface 401 and an output port coupled to mixed signal circuitry 430. Mixed signal circuitry 430 has N internal and external pins. Switches SW_1–SW_N are coupled between output pins OUT1–OUTN and the N internal and external pins, respectively. The test mode output ports TM—1–TM_N are coupled to and arranged to control switches SW_1–SW_N, respectively.

In the embodiment of FIG. 4, a data communication interface is established by protocol logic interface 401 over input pins TMDATA and TMCLK. In another embodiment, the input pins AUX1 and AUX2 may also be used to establish the data communication interface. Control and configuration information is received and processed by the protocol logic interface 401. Control and configuration information may be stored in either a volatile memory 402 or a non-volatile memory 403. The control and configuration information is then used to adjust the analog and digital portions of the system for one of the test modes.

In the embodiment shown in FIG. 4, N possible test modes exist: TM_1–TM_N. When one of the test modes is activated, the system causes one of the N switches SW_1–SW_N, to connect one of the internal nodes I to an output pin. Alternatively, if the system is in a test mode, the electronic system may be reconfigured from a normal configuration into some other configuration.

When protocol logic interface 401 receives certain control and configuration signals, the system will enter a predetermined test mode configuration. For example, when the protocol logic interface receives the proper control and configuration information to activate test mode 1, the test mode 1 output will activate a switch, such as SW_1, that will cause an internal node of the analog circuit to be connected to one of the outputs of electronic system 400. While in such a configuration, critical internal nodes of the analog circuits can be measured and additional control and configuration information can be transmitted to the protocol logic interface. This control and configuration information may be used to verify functionality of the block being tested or used to make internal adjustments to the analog circuit. For example, control information can be transmitted to protocol logic interface 401 and stored in volatile memory 402. The value stored in volatile memory 402 can then be used to program a digital to analog converter that has an output coupled to a critical internal node of the analog circuit, thereby causing a minor change in the state of the internal node. The effect of such adjustments on critical internal nodes can be monitored externally and a range of control signals can be transmitted to the protocol logic interface to cause the digital to analog converter to move through a range of values. In this manner, a search can be implemented to obtain the optimum value of the internal node. After the internal nodes are validated, the electronic system may then receive more external signals, which deactivate the test mode 1 output and cause switch SW_1 to disconnect the internal node from the output pin and reconnect an external node to the output pin. The system may then undergo additional testing and the part can be powered down and shipped to a customer. Other test modes can cause other external pins to be disconnected from other output pins and cause other critical internal pins to be connected to the output pins of the electronic system, for example.

Additionally, protocol logic interface 401 may receive control and configuration information, which causes the digital and/or analog portions of the chip to be reconfigured to perform different analog and digital functions. For example, internal functional blocks may be switched in or out of a signal path or voltage measurement circuits can be connected or disconnected from an output node.

Figure 5:
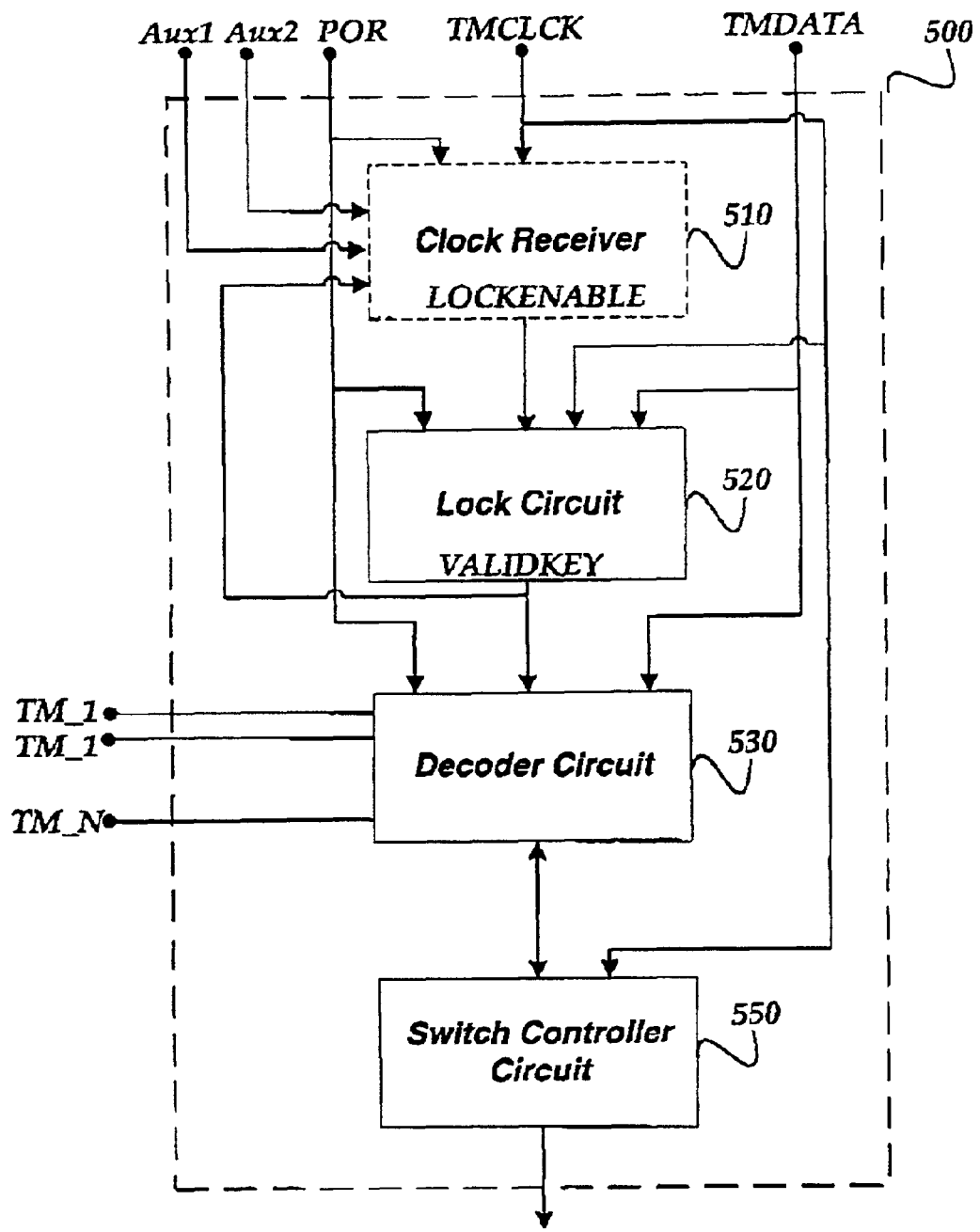
FIG. 5 shows a schematic block diagram of a protocol logic interface.

FIG. 5 illustrates a schematic diagram of a protocol logic interface, according to one embodiment of the present invention. As shown in the figure, the protocol logic interface 500 includes an optional clock receiver circuit 510, a lock circuit 520, a decoder circuit 530, and a switch controller circuit 550.

Optional clock receiver circuit 510 includes input ports TMCLCK, POR, AUX1, AUX2, VALIDKEY and is coupled to lock circuit 520. Lock circuit 520 includes input ports POR, LOCKENABLE, TMCLK, TMDATA, output port VALIDKEY, and is coupled to decoder circuit 530. Decoder circuit 530 includes output ports for each of the N test modes, and is coupled to switch controller circuit 550. Switch controller circuit 550 includes an input port TMDATA, and includes an output port.

The protocol logic interface unit 500 establishes a communication link by receiving the TMCLK and TMDATA at its inputs. Optionally, the AUX1, AUX2, and POR signals may also be used to provide additional protection for the data stored in the memory units. For the purposes of the following explanation, we will assume that only TMCLK and TMDATA are used to establish a communication link. TMCLK is transmitted to the input of clock receiver circuit 510. Clock receiver circuit 510 checks the characteristics of the clock signal and, if the clock signal is a valid clock signal, a LOCKENABLE (enable) output is transmitted to lock circuit 520. The LOCKENABLE signal locks and unlocks the ability to enter the key sequence into the lock circuit 520 for enabling decoder circuit 530.

The clock receiver circuit 510 includes the POR, AUX1, and AUX2 inputs to provide additional security for the data. The AUX1 and AUX2 inputs provide for additional security against accidental access to a memory unit or accidental activation of one of the test mode states.

The operation of the lock circuit 520 and the protocol for unlocking the protocol logic interface will now be described. Lock circuit 520 receives a particular sequence of analog or digital signals to "unlock" lock circuit 520 helping to ensure proper operation of the circuit. Many techniques may be used to insure that false "key" signals to unlock the circuit are not accidentally issued to these pins. Among these techniques are the requirements that the sequential valid-key signals only follow a power-on-reset of the chip, or that certain timing or phasing of the key signals be conformed too. Once a valid-key signal is issued, a serial decoder address signal can be passed to the decoder circuit 530 indicating that the circuit is "unlocked."

According to one embodiment, lock circuit 520 is comprised of a state machine that receives TMCLK, TMDATA, and LOCKENABLE as inputs. Additionally, lock circuit 520 may also optionally receive a POR signal for use in resetting the state machine to its zero, or initial, state. Before any test mode can be entered and before data can be stored in the memory unit, lock circuit 520 unlocks decoder circuit 530. This is accomplished by providing a state machine that only provides a VALIDKEY output signal when a predetermined sequence of both TMCLK and TMDATA have been received. After the system has been unlocked by the predetermined sequence of the TMCLK and TMDATA, system 500 can receive commands to either activate one of the N test modes TM_1–TM_N, or conduct a transaction with a memory unit (See FIG. 4). Commands are communicated to the protocol logic interface over the TMCLK and TMDATA lines.

Decoder circuit 530 receives the commands configuring the test modes. Decoder circuit 530 determines the control of the state of the bank of switches that turn on certain safety blocks that would otherwise hide the operation of the selected block or blocks. Commands are received serially on the TMDATA line. The VALIDKEY output signal from the lock circuit is also input to the decoder control circuit 530 to deactivate the decoder if the VALIDKEY signal is not active. The output of the decoder is comprised of N test mode signals TM_1–TM_N, and control signals for interfacing with a memory unit.

The switch controller circuit 550 has an input for receiving a signal to control the switches for accessing the test modes within the circuit. Switch circuit 550 is responsive to the output of decoder circuit 530 and opens or closes internal switches within the IC.

Figure 6:
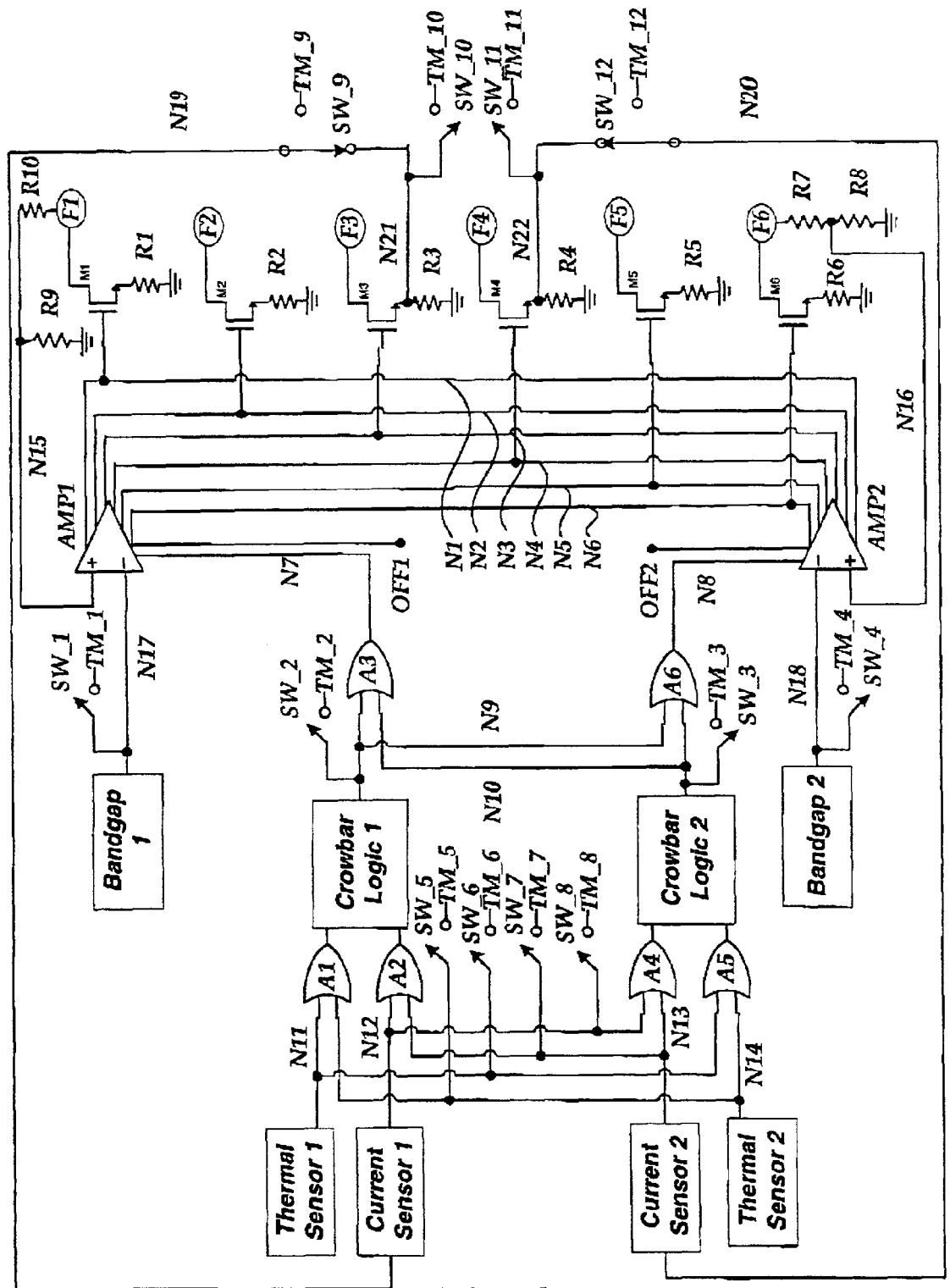
FIG. 6 shows an exemplary schematic diagram of a shunt regulator system including circuitry to verify redundancy of the functional blocks.

FIG. 6 shows an exemplary schematic of a shunt regulator system including extra circuitry to verify redundancy. As shown in the figure, shunt regulator system 500 includes, thermal sensor 1 and 2, current sensor 1 and 2, AND gates A1–A6, crowbar logic 1 and 2, bandgap 1 and 2, amplifiers AMP1 and AMP2, transistors M1–M6, switches SW1–SW12, resistors R1–R10, and test mode pins TM1–TM12.

Amplifier AMP1 has an inverting input coupled to node N17, and a non-inverting input coupled to node N15. The non-inverting input is set up in a feedback mode and receives the output from transistor M1. AMP1 has an enable/disable input port OFF1 and an input coupled to node N7. Bandgap 1 is coupled to node N17.

Amplifier AMP2 has an inverting input coupled to node N18, and a non-inverting input coupled to node N16. The non-inverting input is set up in a feedback mode and receives the output from transistor M6. AMP2 has an enable/disable input port OFF2 and an input coupled to node N8. Bandgap 2 is coupled to node N18.

AMP1 and AMP2 each have six outputs coupled to nodes N1–N6, respectively.

Nodes N1–N6 are coupled to the gates of transistors M1–M6, respectively. The sources of transistors M1–M6 are coupled to a resistor, R1–R6 respectively, coupled in series with ground. The drains of transistors M1–M6 are coupled to pins F1–F6, respectively. P1–F6 are coupled to a power bus (not shown).

AND gate A1 and redundant AND gate A5 each have an input coupled to node N11 and an input coupled to node N14 AND gate AZ and redundant AND gate A4 each have an input coupled to node N12 and an input coupled to node N13. AND gate A3 and redundant AND gate A6 each have an input coupled to node N9 and an input coupled to node N10.

Thermal sensor 1 has an output port coupled to node N11, and redundant thermal sensor 2 has an output port coupled to node N14. Current sensor 1 has an output port coupled to node N12 and an input port coupled to node N19, and redundant current sensor 2 has an output port coupled to node N13 and an input port coupled to node N20. Crowbar logic 1 has an output port coupled to node N9 and input ports coupled to the output of A1 and A2, and redundant crowbar logic 2 has an output port coupled to node N10 and input ports coupled to the output of A4 and A5.

Switches SW1–SW12 are coupled to nodes N17 (SW1), N9 (SW2), N10 (SW3), N18 (SW4), N14 (SW5), N11 (SW6), N13 (SW7), N12 (SW8), N19 (SW9), N21 (SW10), N22 (SW11) and N20 (SW12). N21 is coupled to the source of transistor M3. N22 is coupled to the source of transistor M4.

Briefly described, the shunt regulators are protected from very high-energy charging sources. The protection is achieved by forcing the power pass elements to voltage saturation mode and reducing the shunt voltage to the lowest level possible for the given pass element's transconductance. The activation of the self-protection mode of operation is in response to circuits that sense either elevated chip temperature or excessive pass element current combined with delay networks that generate delays inversely proportional to the current magnitude.

Amplifiers AMP1 and AMP2 are each able to control the six redundant transistors. According to one embodiment, transistors M1–M6 are FETs. FETs M1 and M6 have feedback to the inputs of the redundant amps to form shunt regulators. The regulators are voltage limiters for the lithium-ion cell to prevent the cells from becoming overcharged. Each redundant amplifier has an independent bandgap reference. The shunt regulator protects itself from overheating in the event of very high shunt currents; therefore, CB (crowbar) signals to amplifiers force the gates of the FET to the cell voltage to reduce the shunt voltage to a minimum power state. There is a switch (not shown) to disconnect the F pins from the cell. The crowbar signals are generated by either FET current detectors (fast crowbar) or by chip temperature (thermal sensor). The shunts are critical to the safety of the cell and the crowbar modes are critical to the protection of the shunt circuits.

To test the redundancy of the functional blocks, multiplicities of switches are used. For the example illustrated in FIG. 6, switches one through twelve (SW1–SW12) are shown. The switches accept direct internal signals from test pins one through twelve (TM1–TM12). SW_1 allows a signal coupled to node N17 to be provided at TM_1 to test the functionality relating to bandgap 1. Similarly, SW_4 allows a signal coupled to node N18 to be provided at TM_4 to test the functionality relating to bandgap 2.

Switches SW_2 and SW_3 allow a signal to be coupled to nodes N9 and N10, respectively, to be provided at TM_2 and TM_3 to test the functionality relating to AND gates A3 and A6. Switches SW_5 and SW_6 allow a signal to be coupled to nodes N14 and N11, respectively, to be provided at TM_5 and TM_6 to test the functionality relating to AND gates A1 and A5. Switches SW_7 and SW_8 allow a signal to be coupled at nodes N13 and N12, respectively, to be provided at TM_7 and TM_8 to test the functionality relating to AND gates A2 and A4.

Switches, SW9 and SW12 allow an externally provided signal to be coupled to nodes N19 and N20, respectively, at TM_9 and TM_10 to be used to excite current sensor 1 and current sensor 2 to test the functionality of the blocks, as well as to trim the thresholds of the blocks. Switches, SW_10 and SW_11 allow an externally provided signal at TM_10 and TM_11 to be coupled to node N21 and N22, respectively, to be used to monitor the signal at N21 and N22, respectively. For example, external components may be coupled between TM_9 and TM_10 to measure the current. As will be appreciated externally provided signals may be provided to any of the blocks. The OFF1 and OFF2 enable/disable inputs determine what shunt regulator amplifier will be active at any given time, therefore assuring both to be active. All of these tests help to ensure that redundancy is actually provided. As will be appreciated in view of the present disclosure more or less test mode pins and switches may be included to test the functionality of the blocks and redundant blocks.

The illustrated example was for explanatory purposes only. Any IC including redundant functional blocks may include the extra circuitry used for testing the functions on the IC.

Figure 7:
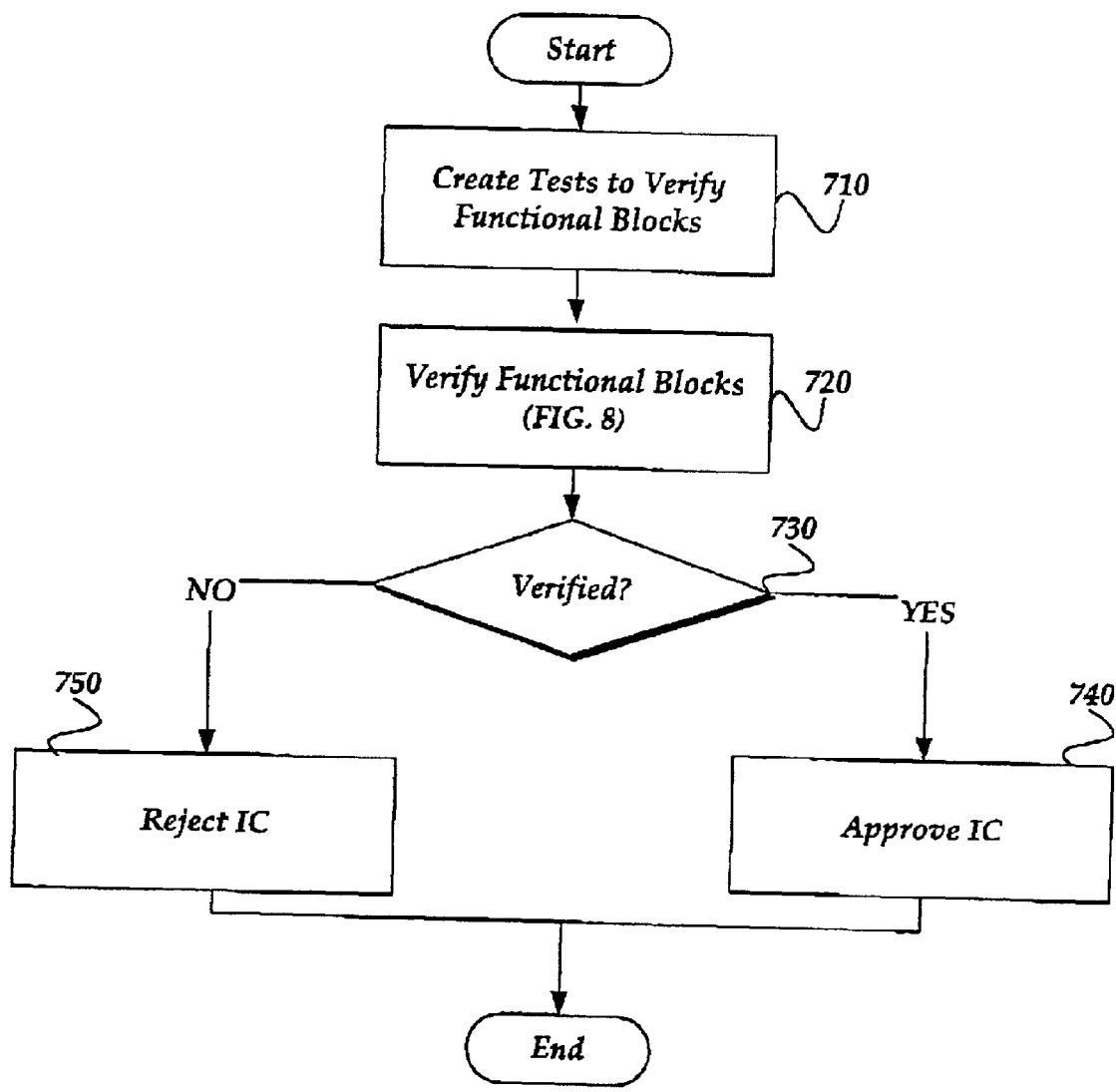
FIG. 7 illustrates a logical flow diagram for verifying redundant safety functions on an integrated circuit.

FIG. 7 illustrates a logical flow diagram for verifying redundant safety functions on an integrated circuit, according to one embodiment of the invention. After a start block, the logical flow moves to a block 710, where tests are created to verify the functional blocks within the integrated circuit. The tests should be designed such that the functionality of the critical component parts are thoroughly tested. Transitioning to a block 720, the functional blocks within the IC are verified (See FIG. 8 and related discussion). Moving to a decision block 730, a determination is made as to whether the functional blocks tested were verified. If the functional blocks were verified, the logical flow moves to a block 740 where the IC is approved and the circuit is known to be redundant. If the functional blocks were not verified, the logical flow moves to a block 750 where the IC is rejected because the IC is not truly redundant. The logical flow then ends.

Figure 8:
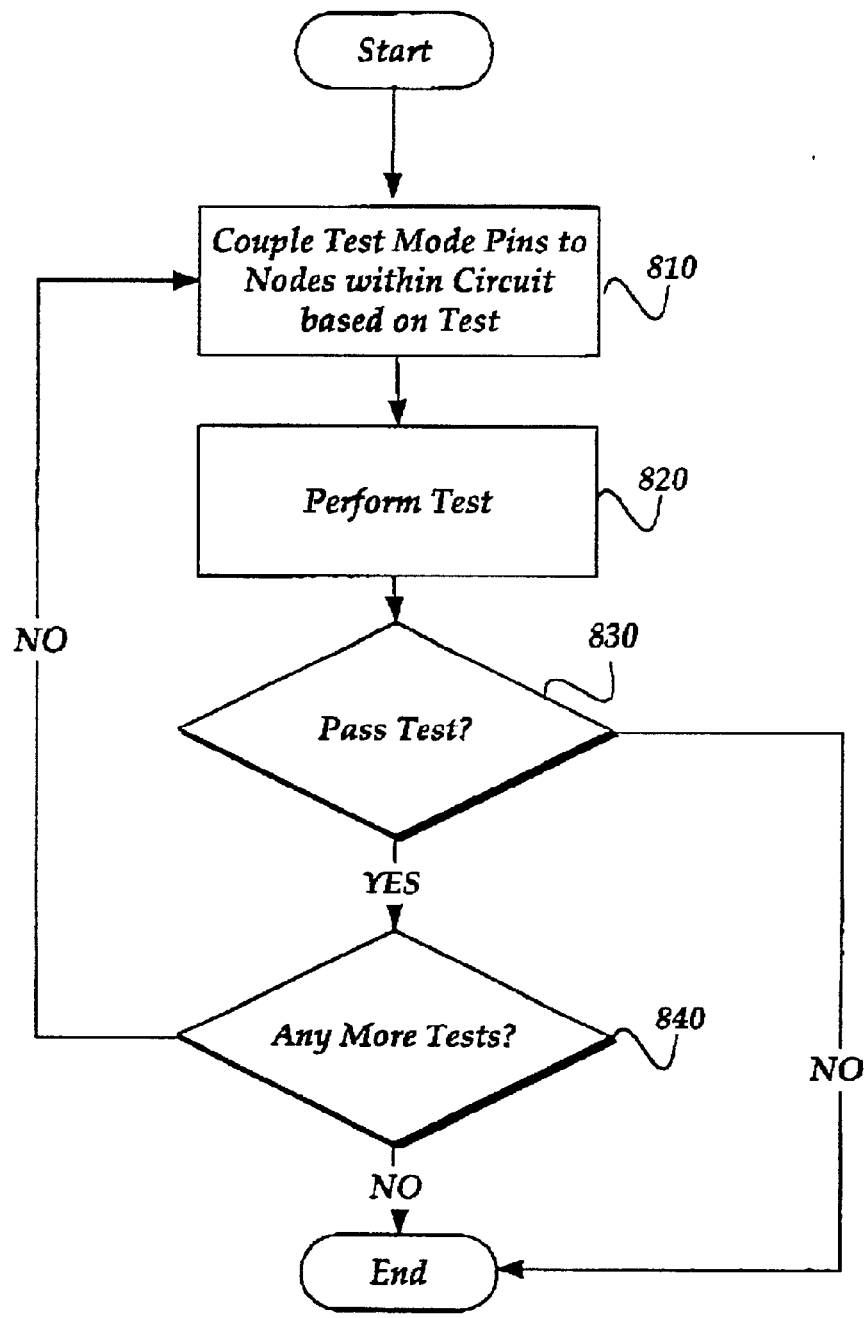
FIG. 8 illustrates a logical flow for verifying functional blocks on an IC, according to one embodiment of the invention.

FIG. 8 illustrates a logical flow for verifying functional blocks on an IC, according to one embodiment of the invention. After a start block, the logic moves to a block 810, at which point test pins are coupled to nodes within the integrated circuit based on the created test to verify the functional block. The test pins are located within the circuit so that the functionality of the blocks may be tested to ensure redundancy of the functional blocks. Moving to a block 820, a test is performed to test the functionality of a block. As will be appreciated in view of the present disclosure, the test conducted depends on the functionality of the block. The test may be as simple as proving a logical high ("1") signal to an inverter circuit to determine if the inverter circuit outputs a logical low ("0") signal. Transitioning to decision block 830, a determination is made as to whether the block passed the test. If the block passes the test, the logic flows to a decision block 840, to determine if there are any more tests to run. When there are more tests to run, the logic flow returns to block 810, at which point the next test is run. When the block did not pass the test, the logic flow ends and the chip is not verified (See block 730 of FIG. 7 and related discussion). When there are no more tests to run, the logic flow ends.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for verification of redundant functions on a circuit, comprising:
   a circuit function block having nodes, the nodes arranged to access each of the redundant fictions on the circuit;
   a test interface circuit including an input and an output, the input arranged to receive an input signal, and in response to the input signal, supply a test signal, indicating a function on the circuit to test; and
   the circuit function block arranged to receive the test signal, and in response to the test signal couple at least one of the nodes within the circuit function block to the output of the test interface such that the function may be tested.

2. The apparatus of claim 1, wherein the circuit function block, further comprises:
   a functional block, arranged to receive the test signal, and in response to the test signal couple at least one node within the functional block to the output of the test interface such that the function may be tested; and
   a redundant functional block, arranged to receive the test signal, and in response to the test signal couple at least one corresponding node to the output of the test interface such that the function may be tested, the at least one corresponding node accessing the same relative location within the redundant functional block as the at least one node within the functional block.

3. The apparatus of claim 2, further comprising, a controller circuit arranged to receive the test signal and in response to the control signal selectively couple the at least one of the nodes within the functional block and the at least one of the corresponding nodes within the redundant functional block to the output of the test interface.

4. The apparatus of claim 3, wherein the test interface comprises a plurality of input pins and a plurality of output pins, each of the input pins arranged to receive the test signal, and each of the output pins arranged to provide an external signal.

5. The apparatus of claim 4, wherein the test interface further comprises:
   an input test interface arranged to receive the input signal and output the test signal; and
   an output test interface arranged to output the external signal.

6. An apparatus for redundant function verification for an integrated circuit, the circuit a mixed signal circuit and configuration, control and testing circuitry for the mixed signal circuit, comprising:
   a protocol logic interface circuit arranged to receive a control signal and arranged to activate a test mode within the circuit in response to the control signal, the test mode arranged to test a functional block and a redundant functional block within the circuit;
   a mixed signal circuit including access lines to internal nodes and external nodes of the integrated circuit; the internal nodes and the external nodes selected in response to the test mode;
   a switch circuit coupled between output pins and the internal and external nodes, respectively, the switch circuit arranged to connect the internal nodes and external nodes to the output pins in response to the test mode to test the functional block and the redundant functional block within the circuit.

7. The apparatus of claim 6, further comprising, a memory circuit arranged to store configuration information in response to the test mode.

8. The apparatus of claim 7, wherein the protocol logic interface circuit, further comprises:
   a lock enable circuit arranged to receive a lock enable signal;
   a lock circuit coupled to the lock enable circuit and arranged to receive the lock enable signal and produce a valid key signal in response to the lock enable signal.

9. The apparatus of claim 8, further comprising a decoder circuit, the decoder circuit coupled to the lock circuit and arranged to receive the valid key signal and the control signal, the decoder circuit arranged to configure the test mode in response to the valid key signal and the control signal.

10. A method for verifying redundancy of a functional block within a circuit, comprising:
    receiving an input signal at a test interface circuit and from the test interface circuit supplying a test signal indicating a function on the circuit to test;
    receiving the test signal at a circuit function block, wherein the circuit function block includes nodes arranged to access each of the redundant functions on the circuit;

in response to the test signal, coupling at least one of the nodes within the circuit function block to an output of the test interface circuit such that the function may be tested;

testing the function to verify the redundancy of the functional block within the circuit; and determining if the functional block circuit passed the test.

11. The method of claim 10, further comprising, when the functional block passed the test approving the circuit, otherwise, rejecting the circuit.

12. The method of claim 11, wherein performing the test to verify the redundancy of the functional block within the circuit, comprises performing the test on each of the corresponding functional blocks that are redundant within the circuit.

13. The method of claim 12, wherein performing the test to verify the redundancy of the functional block within the circuit, further comprises;

coupling at least one test mode pin to a node within the circuit based on the test; and performing the test through the use the at least one test mode pin.

14. An apparatus to verify redundancy of functions included on an integrated circuit with a mixed signal circuit and configuration, a control and testing circuit for the mixed signal circuit, comprising:

input terminals arranged to convey input signals and configuration control signals;

interface terminals arranged to convey interface signals and analog interface signals;

an interface circuit coupled to the input terminals that is arranged to provide configuration data and switch control signals in response to control signals, the configuration; and an analog circuit with redundant functions, the analog circuit including internal nodes and external circuit terminals within each of the redundant functions, coupled to the interface circuit, that is arranged to communicate internal analog signals and external analog signals via the internals nodes and external circuit terminals to each of the redundant functions, in response to a portion of the configuration data.

15. The apparatus of claim 14, further comprising:

a switching circuit that is arranged to alternately couple respective ones of the internal and the external circuit terminals in response to the switch control signals;

wherein respective ones of the internal analog signals and the external analog signals change in response to corresponding changes in respective ones of the portion of the configuration data.

16. The apparatus of claim 15, further comprising a memory circuit, coupled to the interface circuitry and the analog circuit, that stores the configuration data.

17. The apparatus of claim 14, wherein the interface circuitry comprises a data decoding circuit that is coupled to the input terminals and decodes the configuration control signals and is arranged to provide the configuration data and the switch control signals.

18. The apparatus of clam 17, wherein the interface circuitry further comprises, a lock decoding circuit that is coupled between the input terminals and the data decoding circuit that is arranged to enable and disable the data decoding circuit in response to the configuration control signals.

19. The apparatus of claim 18, wherein the switching circuit comprises a plurality of switch circuits.

20. The apparatus of claim 17, further comprising, a mode control circuit, coupled to the interface circuit and provides the test mode control signals in response to the enablement of the data decoding circuit.

21. An apparatus for verifying redundancy of a function on a circuit, comprising:

a means for receiving an input signal at a test interface circuit and supplying a test signal indicating a function on the circuit to test;

a means for receiving the test signal at a circuit function block, wherein the circuit function block includes nodes arranged to access each of the redundant functions on the circuit;

in response to the test signal a means for coupling at least one of the nodes within the circuit function block to an output of the test interface circuit such that the function may be tested;

a means for performing at least one test to verify the redundancy of the function on the circuit; and a means for determining occurrences of the function on the circuit passed the at least one test.

22. The apparatus of claim 21, further comprising, when the occurrences of the function on the circuit passed the at least one test, a means for approving the circuit, otherwise, a means for rejecting the circuit.

* * * * *

UNITED STATES PATENT AND TRADEMARK OFFICE
CERTIFICATE OF CORRECTION

PATENT NO. : 6,871,309 B1
DATED : March 22, 2005
INVENTOR(S) : Smith

It is certified that error appears in the above-identified patent and that said Letters Patent is hereby corrected as shown below:

<u>Title page,</u>
Item [57], ABSTRACT,
Line 4, "fictions" should read -- functions --.

<u>Column 1,</u>
Line 46, "am" should read -- are --.

<u>Column 3,</u>
Line 34, "fictional" should read -- functional --.

<u>Column 7,</u>
Line 41, "P1" should read -- F1 --.
Line 45, "AZ" should read -- A2 --.

<u>Column 9,</u>
Line 49, "fictions" should read -- functions --.

Signed and Sealed this

Nineteenth Day of July, 2005

JON W. DUDAS
*Director of the United States Patent and Trademark Office*